(12) United States Patent
Kondo et al.

(10) Patent No.: US 9,348,378 B2
(45) Date of Patent: May 24, 2016

(54) COMPUTER PROVIDED WITH COOLING SYSTEM

(75) Inventors: Yoshihiro Kondo, Tokyo (JP); Takayuki Fujimoto, Tokyo (JP); Fumio Takeda, Tokyo (JP); Takeshi Kato, Tokyo (JP)

(73) Assignee: HITACHI, LTD., Tokyo (JP)

( * ) Notice: Subject to any disclaimer, the term of this patent is extended or adjusted under 35 U.S.C. 154(b) by 48 days.

(21) Appl. No.: 14/394,906

(22) PCT Filed: Apr. 19, 2012

(86) PCT No.: PCT/JP2012/060571
§ 371 (c)(1),
(2), (4) Date: Oct. 16, 2014

(87) PCT Pub. No.: WO2013/157117
PCT Pub. Date: Oct. 24, 2013

(65) Prior Publication Data
US 2015/0085442 A1    Mar. 26, 2015

(51) Int. Cl.
*H05K 7/20* (2006.01)
*H01L 23/427* (2006.01)
*G06F 1/20* (2006.01)
*H05K 1/02* (2006.01)

(52) U.S. Cl.
CPC ............... *G06F 1/20* (2013.01); *H05K 1/0203* (2013.01); *H05K 7/2039* (2013.01); *H05K 7/20809* (2013.01); *H01L 23/427* (2013.01); *H01L 2924/0002* (2013.01); *H05K 2201/2072* (2013.01)

(58) Field of Classification Search
CPC ....... H01L 23/427; H01L 23/467; G06F 1/20; G06F 2200/201; H05K 7/20245
See application file for complete search history.

(56) References Cited

U.S. PATENT DOCUMENTS

| 5,323,292 A * | 6/1994 | Brzezinski | H01L 23/3675 165/104.33 |
| 8,773,854 B2 * | 7/2014 | Rice | F25B 21/02 165/104.21 |
| 2002/0179284 A1 * | 12/2002 | Joshi | F28D 15/0233 165/80.3 |
| 2005/0122686 A1 * | 6/2005 | Oyamada | H05K 7/20572 361/699 |
| 2012/0140403 A1 * | 6/2012 | Lau | H01L 23/427 361/679.47 |

FOREIGN PATENT DOCUMENTS

| JP | 8-125371 A | 5/1996 |
| JP | 2002-261478 A | 9/2002 |

(Continued)

*Primary Examiner* — Robert J Hoffberg
*Assistant Examiner* — Hung Dang
(74) *Attorney, Agent, or Firm* — Baker Botts L.L.P.

(57) ABSTRACT

The computer having a module board with semiconductor elements mounted on both sides thereof, a motherboard on which a plurality of units of the module board are mounted, and a rack cabinet on which a plurality of units of the motherboard are mounted includes a thermo-siphon that is thermally connected to the semiconductor elements mounted on one side of the module board, a metal plate that is thermally connected to the semiconductor elements mounted on one side of the module board, a thermally-conductive member that transfers the heat of the metal plate to the thermo-siphon in a situation where the heat of the semiconductor elements mounted on one side of the module board is transferred to the metal plate, and a pressing member that presses the thermo-siphon and the metal plate against the semiconductor elements mounted on the module board.

6 Claims, 7 Drawing Sheets

(56) References Cited

FOREIGN PATENT DOCUMENTS

| | | |
|---|---|---|
| JP | 2005-167102 A | 6/2005 |
| JP | 2005-223099 A | 8/2005 |
| JP | 2008/10768 A | 1/2008 |
| JP | 2009-16605 A | 1/2009 |
| JP | 2009-295762 A | 12/2009 |
| JP | 2010-79403 A | 4/2010 |
| JP | 2010-80507 A | 4/2010 |

* cited by examiner

COMPUTER PROVIDED WITH COOLING SYSTEM

TECHNICAL FIELD

The present invention relates to a computer provided with a cooling system.

BACKGROUND ART

IT devices are configured so that several CPUs, memories, and control elements are mounted on a circuit board. A backplane on the rear side of a rack supplies electrical power to the circuit board and exchanges signals with the circuit board.

In recent years, high-density packaging of CPUs and memories is essential in order to process an enormous amount of data, thereby providing an improved capability. Therefore, one-hundred or more module boards, which are prepared by mounting CPUs, memories, and control elements on both sides of the module boards, are mounted on a large-size motherboard. As such being the case, the module boards have to be unmounted and remounted whenever they need to be accessed for the purpose of maintaining and servicing the CPUs and memories.

As a prior-art technology concerning the above-mentioned module boards, a heat dissipation structure and its manufacturing method are disclosed in Japanese Patent Application Laid-Open No. 2009-16605 (PTL 1). This heat dissipation structure makes it possible to eliminate the variation of a heat dissipation surface, achieve heat dissipation with high efficiency, reduce the size and weight of a device, and provide increased ease of device assembly.

Further, a prior-art technology disclosed in Japanese Patent Application Laid-Open No. 2005-223099 (PTL 2) provides a first electronic component heat transfer cover and a second electronic component heat transfer cover. The first electronic component heat transfer cover, which is shaped like an inverted dish, covers all electronic components mounted on the upside of an electronic circuit board. The second electronic component heat transfer cover, which is also shaped like an inverted dish, covers all electronic components mounted on the underside of the electronic circuit board.

Furthermore, a prior-art technology disclosed in Japanese Patent Application Laid-Open No. 2008-010768 (PTL 3) provides a circuit board that is sandwiched between a first heat sink and a second heat sink. The first heat sink is equipped with a heat pipe and attached to the upside of the circuit board. The second heat sink is attached to the underside of the circuit board.

Moreover, a prior-art technology disclosed in Japanese Patent Application Laid-Open No. 2010-080507 (PTL 4) provides a method of thermally connecting a CPU, which is a major heat source mounted on a wiring board, to one outer surface of a thermo-siphon, attaching a plurality of heat pipes to the other outer surface of the thermo-siphon, and establishing a thermal connection by attaching one end of each heat pipe to the upside of an element generating a small amount of heat.

Besides, a prior-art technology disclosed in Japanese Patent Application Laid-Open No. Hei 08 (1996)-125371 (PTL 5) provides a method of cooling heat-generating components through a metal core incorporated in an inner layer of a printed circuit board, disposing a retaining member between the printed circuit board and a guide section, thermally connecting a cooling plate to the guide section in order to transfer heat to a fluid, and securing the printed circuit board to the guide section to thermally connect the metal core in the printed circuit board to the guide section.

CITATION LIST

Patent Literature

PTL 1: Japanese Patent Application Laid-Open No. 2009-16605
PTL 2: Japanese Patent Application Laid-Open No. 2005-223099
PTL 3: Japanese Patent Application Laid-Open No. 2008-010768
PTL 4: Japanese Patent Application Laid-Open No. 2010-080507
PTL 5: Japanese Patent Application Laid-Open No. Hei 08 (1996)-125371

SUMMARY OF INVENTION

Technical Problem

As described earlier, IT devices are configured so that several CPUs, memories, and control elements are mounted on a circuit board. A backplane on the rear side of a rack supplies electrical power to the circuit board and exchanges signals with the circuit board.

Meanwhile, as described earlier, module boards prepared by mounting CPUs, memories, and control elements on both sides are frequently used in recent years in order to process an enormous amount of data. One-hundred or more module boards are mounted on a large-size motherboard. As such being the case, the module boards have to be unmounted and remounted whenever they need to be accessed for maintenance and service purposes.

In other words, it is necessary to provide a cooling structure that is capable of transferring the heat of the double-sided module boards mounted on the motherboard to the outside, such as a remote location, and allowing the module boards to be easily unmounted and remounted.

However, when the prior-art technologies described in PTLs 1 to 5 are used in a situation where air cooling is provided, a large-size blower fan is required due to a narrow space. Further, when the double-sided module boards are used, the semiconductor elements mounted on the underside cannot be cooled by the theme-siphon. Besides, as the thermo-siphon is screwed down to the CPUs, the module boards cannot be unmounted and remounted. Solutions to these problems are not given in PTLs 1 to 5.

An object of the present invention is to provide a computer provided with a power-saving, low-noise cooling system that transfers the heat of semiconductor elements on the underside of a module board to a thermo-siphon in order to cool the entire module board.

Solution to Problem

In order to achieve the above object, the present invention provides a computer that has a module board with semiconductor elements mounted on both sides thereof, a motherboard on which a plurality of units of the module board are mounted, and a rack cabinet on which a plurality of units of the motherboard are mounted. The computer includes a thermo-siphon, a metal plate, a thermally-conductive member, and a pressing member. The thermo-siphon is thermally connected to the semiconductor elements mounted on one side of the module board. The metal plate is thermally connected to the semiconductor elements mounted on one side of the module board. The thermally-conductive member transfers the heat of the metal plate to the thermo-siphon in a situation where the heat of the semiconductor elements mounted on one side of the module board is transferred to the metal plate. The pressing member presses the thermo-siphon and the metal plate against the semiconductor elements mounted on the module board.

In order to achieve the above object, the present invention is preferably configured so that the pressing member is formed of a screw that penetrates through the thermo-siphon and brings a protrusion of the metal plate into contact with the surface of the thermo-siphon.

In order to achieve the above object, the present invention is preferably configured so that the pressing member is formed of a clip that holds the thermo-siphon and the metal plate together.

In order to achieve the above object, the present invention is preferably configured so that the clip is formed of an elastic metal member and shaped like a U-shaped hair pin.

In order to achieve the above object, the present invention is preferably configured so that the pressing member is formed of a leaf spring disposed between the metal plate and the motherboard.

In order to achieve the above object, the present invention is preferably configured so that the leaf spring is formed of an elastic metal member and provided with a flat surface that comes into contact with the metal plate.

Advantageous Effects of Invention

The present invention makes it possible to provide a computer provided with a power-saving, low-noise cooling system that transfers the heat of semiconductor elements on the underside of a module board to a thermo-siphon in order to cool the entire module board.

DESCRIPTION OF EMBODIMENTS

Embodiments of the present invention will now be described with reference to the accompanying drawings.

First Embodiment

Figure 1A:
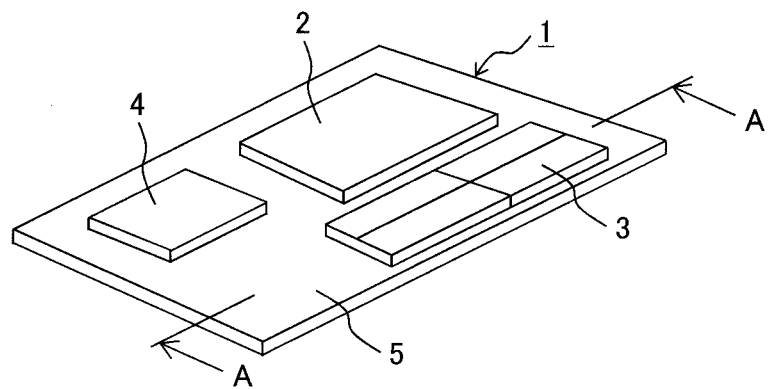
FIG. 1 illustrates how a CPU board according to an embodiment of the present invention is implemented.
Figure 1B:
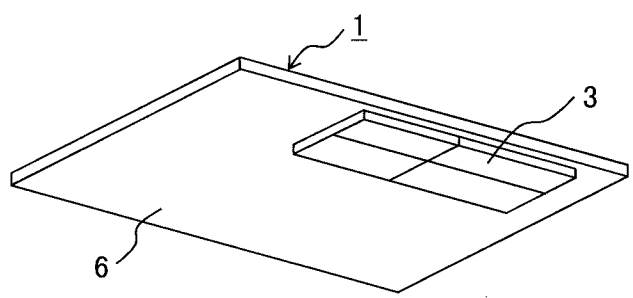
Figure 1C:
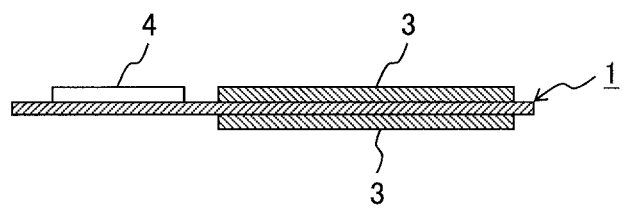

FIG. 1 shows the shape of a CPU board. FIG. 1(*a*) is a perspective view of the upside of the CPU board. FIG. 1(*b*) is a perspective view of the underside of the CPU board. FIG. 1(*c*) is a cross-sectional view taken along line A-A of FIG. 1(*a*). In this document, a module board on which at least a CPU is mounted is referred to as the CPU board.

Referring to FIG. 1(*a*), a CPU 2, memories 3, and a controller element 4 are mounted on the upside 5 of the CPU board 1.

Referring to FIG. 1(*b*), the memories 3 are exposed to view from the underside 6 of the CPU board 1. The reason is that the memories 3 are mounted on both the upside 5 and the underside 6 of the CPU board 1 as shown in FIG. 1(*c*).

Figure 2:
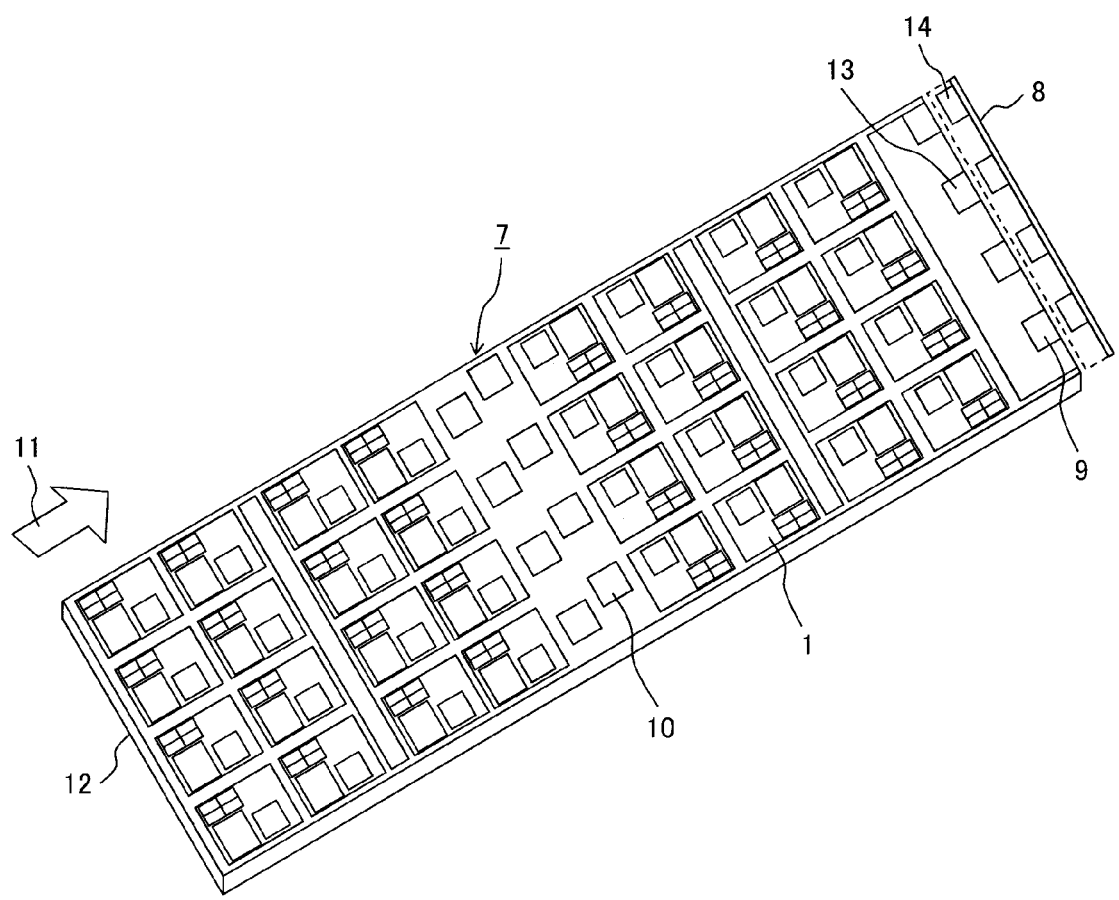
FIG. 2 is a perspective view illustrating how a motherboard according to an embodiment of the present invention is implemented.

FIG. 2 is a perspective view illustrating a motherboard on which a large number of units of the CPU board described with reference to FIG. 1 are mounted.

Referring to FIG. 2, a large number of units of an optical module 10 and a large number of units of the CPU board 10 are mounted on the motherboard 7. The motherboard 7 can be inserted in an insertion direction 11 from the front end 12 and extracted. Thus, the rear end 8 of the motherboard 7 is provided with an optical connector 14, a signal connector 9, and a power connector 13 and is to be connected to another motherboard.

The motherboard 7 is to be inserted in the insertion direction 11 from the front end 12. The CPU board 1 can be accessed for maintenance when the front end 12 of the motherboard 7 is extracted.

Figure 3:
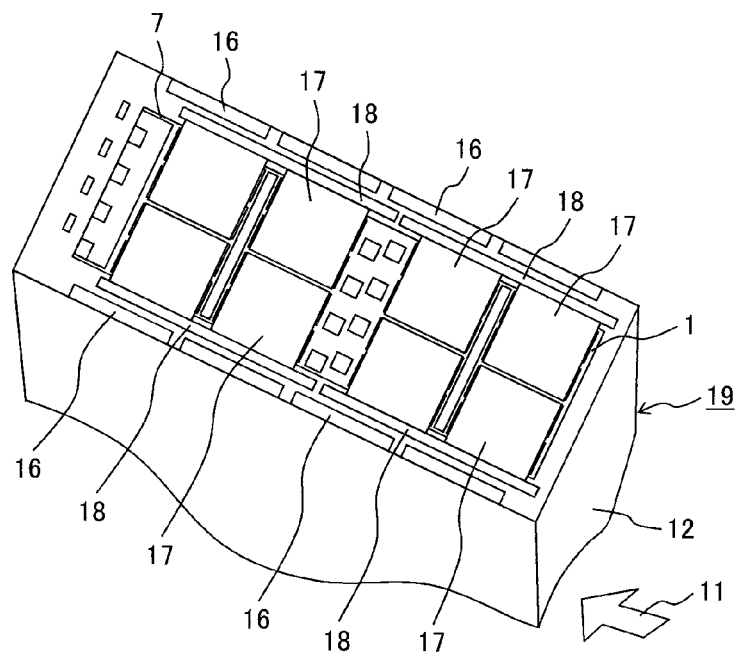
FIG. 3 is a partial perspective view illustrating a rack for a computer system according to an embodiment of the present invention.

FIG. 3 is a partial top perspective view illustrating how the motherboard 7 described with reference to FIG. 2 is mounted on a rack 19.

Referring to FIG. 3, a power supply unit 16 is mounted on both sides of the rack 19 for power feeding purposes. A thermo-siphon 17 is mounted on the motherboard 7. A thermal highway 18 is mounted in the power supply unit 16 to provide thermal transport by means of vaporization heat. The thermo-siphon 17 is capable of collectively cooling four units of the CPU board 1. In other words, one unit of the thermo-siphon 17 covers four units of the CPU board 1 while maintaining thermal contact with them. As eight units of the thermo-siphon 17 are disclosed in the present embodiment, there are a total of 32 units of the CPU board 1.

One unit of the thermal highway 18 is extended to cover the width of two units of the thermo-siphon 17 in order to provide thermal transport for the two units of the thermo-siphon 17. In the present embodiment, thermal transport is provided by using one unit of the thermo-siphon 17 for four units of the CPU board 1 and by using one unit of the thermal highway 18 for two units of the thermo-siphon 17. However, the number of units may vary with an employed structure. In FIG. 3, the reference sign 12 denotes the front end.

Figure 4:
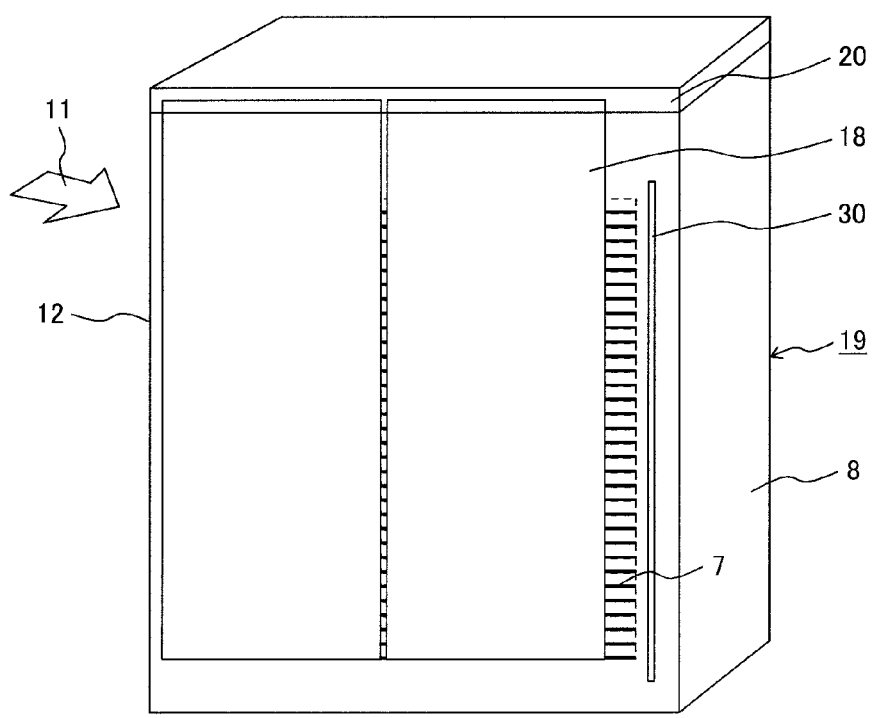
FIG. 4 is a perspective view illustrating the rack for the computer system according to an embodiment of the present invention.

FIG. 4 is a side perspective view illustrating the rack 19 described with reference to FIG. 3.

Referring to FIG. 4, an infinite number of units of the motherboard 7 are vertically mounted on the rack 19. A power supply busbar 30 is disposed on the rear end 8 of the rack 19 in order to efficiently feed electrical power to each motherboard 7. No structure is mounted on the front end 12 so as to facilitate the unmounting and remounting of each motherboard 7. A heat exchanger 20 is disposed on the top of the rack 19 and thermally connected to the thermal highway 18 mounted on a lateral surface of the rack 19.

The above-mentioned thermal connection is made, for example, by vapor on the side toward the thermal highway 18 and by the single liquid-phase of the heat exchanger 20 on the top. In FIG. 4, the reference sign 12 denotes the front end.

Figure 5:
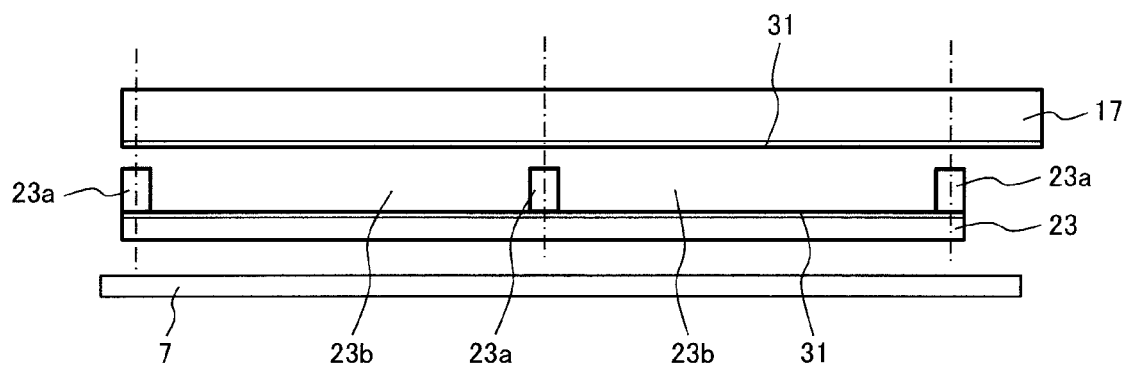
FIG. 5 is a front view illustrating a section around the motherboard before the insertion of the CPU board according to a first embodiment of the present invention.

FIG. 5 is a front view illustrating a section around the motherboard before the insertion of the CPU board.

Referring to FIG. 5, a flat heat pipe or metal plate 23 (hereinafter referred to as the metal plate 23) is mounted on the top of the motherboard 7. The thermo-siphon 17 is mounted above the metal plate 23 with a space 23b provided in-between. A thermally-conductive sheet 31 is disposed on opposing surfaces of the metal plate 23 and thermo-siphon 17 and on protrusions 23a of the metal plate 23.

The vertical distance between the motherboard 7 and the thermo-siphon 17 is fixed. The metal plate 23 moves between the motherboard 7 and the thermo-siphon 17.

Figure 6:
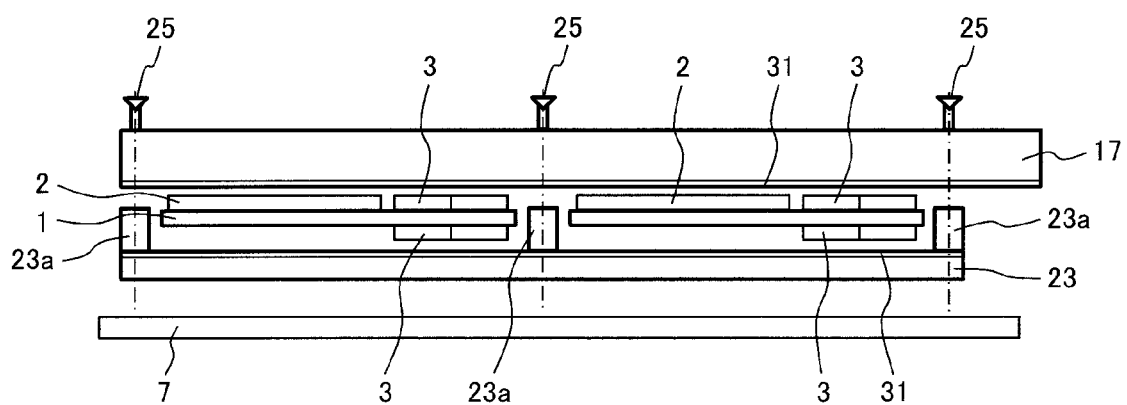
FIG. 6 is a front view illustrating the section around the motherboard after the insertion of the CPU board according to the first embodiment.

FIG. 6 is a front view illustrating the section around the motherboard after the insertion of the CPU board.

Referring to FIG. 6, screws 25 are attached to the thermo-siphon 17. The screws 25 are positioned to oppose the protrusions 23a, which protrude upward from the metal plate 23 below the thermo-siphon 17. The thermally-conductive sheet 31 described with reference to FIG. 5 is disposed in contact with the upside or underside of the CPU 2, memories 3, and controller element 4 (not shown) mounted on the CPU board 1.

More specifically, first of all, the metal plate 23 is disposed in the space 23b between the motherboard 7 and the thermo-siphon 17 as shown in FIG. 6. The metal plate 23 has the protrusions 23a, which form the space 23b having a predetermined height. The CPU board 1 is then inserted into the space 23b. The screws 25 fasten the protrusions 23a to the thermo-siphon 17.

Therefore, when the screws 25 are tightened, the protrusions 23a of the metal plate 23 become attracted to the thermo-siphon 17, and the CPU 2 and memories 3 on the upside of the CPU board 1 come into thermal contact with the thermo-siphon 17. Meanwhile, the memories 3 on the underside of the CPU board 1 come into thermal contact with the metal plate 23 through the thermally-conductive sheet 31.

Figure 7:
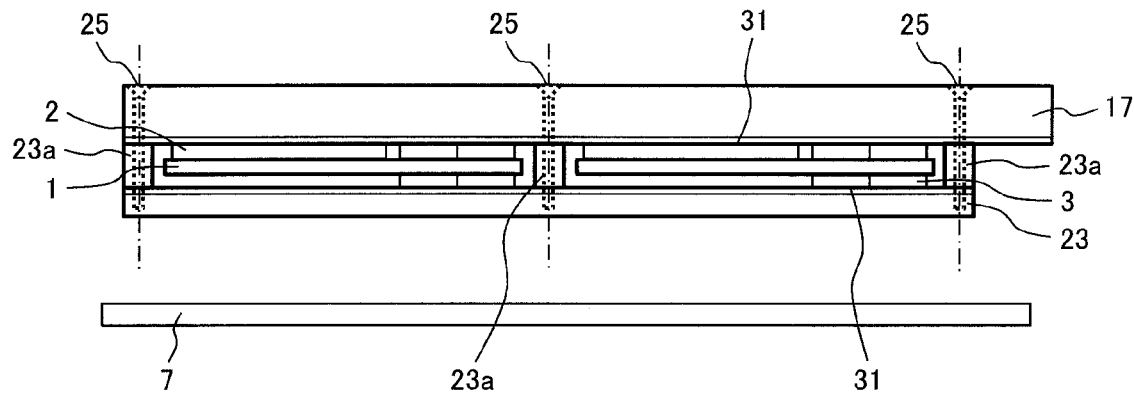
FIG. 7 is a front view illustrating the section around the motherboard after the mounting of the CPU board according to the first embodiment.

FIG. 7 is a front view illustrating the section around the motherboard after the mounting of the CPU board 1 in the first embodiment.

Referring to FIG. 7, tightening the screws 25 moves the metal plate 23 from the motherboard 7 toward the thermo-siphon 17. Through the thermally-conductive sheet 31 attached to the thermo-siphon 17 and the thermally-conductive sheet 31 attached to the metal plate 23, the upper surface (upside) of the CPU board 1 is thermally joined to the thermo-siphon 17 and the lower surface (underside) of the CPU board 1 is thermally joined to the metal plate 23. Further, the protrusions 23a of the metal plate 23 thermally join the metal plate 23 to the thermo-siphon 17.

As is obvious from the above, the heat of the semiconductor elements (CPU 1, memories 2, and controller element 4) on the upside of the CPU board 1 can be thermally transported to the thermo-siphon 17. Further, the heat of the semiconductor elements (memories 2) on the underside of the CPU board 1 can be thermally transported from the metal plate 23 to the thermo-siphon 17 through the protrusions 23a.

According to the present embodiment, the heat of the memories 3 mounted on the underside of the CPU board 1 can be transferred from the metal plate 23 to the thermo-siphon 17 through the protrusions 23a as described above. Therefore, the memories 3 can be efficiently cooled while a simple structure is employed.

When the CPU board 1 is to be replaced or extracted for maintenance purposes, loosening the screws 25 moves the metal plate 23 downward to enlarge the space 23b. When the space 23b is enlarged, the CPU board 1 can be extracted with ease.

Second Embodiment

Figure 8A:
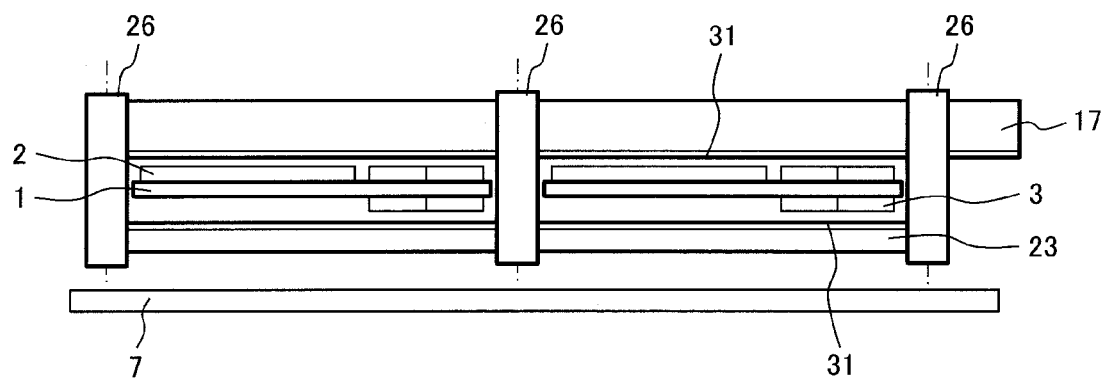
FIG. 8 is a front view illustrating the section around the motherboard after the insertion of the CPU board according to a second embodiment of the present invention.
Figure 8B:
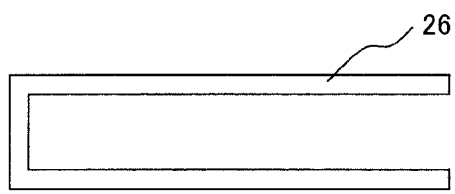

FIG. 8(a) is a front view of the section around the motherboard according to a second embodiment of the present invention. FIG. 8(b) is a side view of a clip.

Referring to FIG. 8(a), the second embodiment is configured so that the clip 26 is disposed to thermally connect the thermo-siphon 17 to the metal plate 23. As shown in FIG. 8(b), the clip 26 is shaped like a U-shaped hair pin and used to hold the thermo-siphon 17 and the metal plate 23 together. The CPU board 1, which is sandwiched between the thermo-siphon 17 and the metal plate 23, is then pressurized.

The thermally-conductive sheet 31 is attached to the surface of the thermo-siphon 17 that comes into contact with the semiconductor elements (CPU 1, memories 2, controller element 4) on the upside of the CPU board 1. The thermally-conductive sheet 31 is also attached to the surface of the metal plate 23 that comes into contact with the semiconductor elements (memories 2) on the underside of the CPU board 1.

Figure 9:
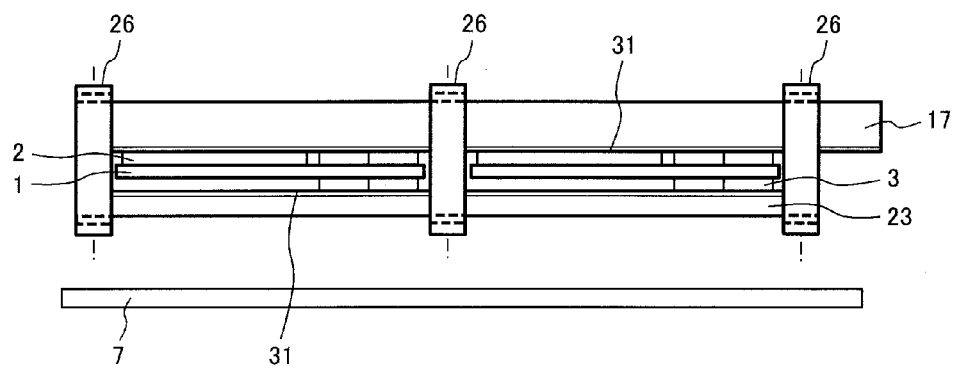
FIG. 9 is a front view illustrating the section around the motherboard after the mounting of the CPU board according to a third embodiment of the present invention.

FIG. 9 is a front view illustrating the section around the motherboard after the mounting of the CPU board according to the second embodiment.

Referring to FIG. 9, inserting the clip 26 in a horizontal direction moves the metal plate 23 from the motherboard 7 toward the thermo-siphon 17. As is the case with FIG. 7, the present embodiment is configured so that, through the thermally-conductive sheet 31, the thermo-siphon 17 and the flat heat pipe or metal plate 23 thermally join the upper surface (upside) of the CPU board 1 to the thermo-siphon 17 and thermally join the lower surface (underside) of the CPU board 1 to the flat heat pipe or metal plate 23. Further, the protrusions of the flat heat pipe or metal plate 23 thermally join the flat heat pipe or metal plate 23 to the thermo-siphon 17.

As is obvious from the above, the heat of the semiconductor elements (CPU 1, memories 2, and controller element 4) on the upside of the CPU board 1 can be thermally transported to the thermo-siphon 17. Further, the heat of the semiconductor elements (memories 2) on the underside of the CPU board 1 can be thermally transported to the thermo-siphon 17 through the flat heat pipe or metal plate 23.

According to the present embodiment, the heat of the memories 3 can be transferred from the metal plate 23 to the clip 26 and then transferred from the clip 26 to the thermo-siphon 17 as described above. Therefore, the heat of the memories 3 can be efficiently dissipated. Further, the present embodiment is configured so that the clip 26 provides the thermal connection between the thermo-siphon 17 and the metal plate 23. This not only makes it extremely easy to attach and detach the clip 26, but also permits the use of a low-cost configuration.

In the present embodiment, the clip 26 is U-shaped. However, the present invention is not limited to the use of a U-shaped clip. The clip 26 may alternatively be in horizontal U shape.

Third Embodiment

Figure 10A:
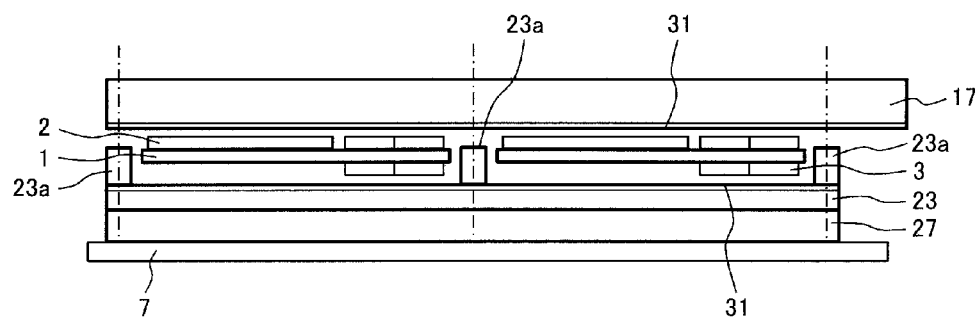
FIG. 10 includes a front view illustrating the section around the motherboard after the insertion of the CPU board according to the third embodiment and a perspective view illustrating a leaf spring.
Figure 10B:
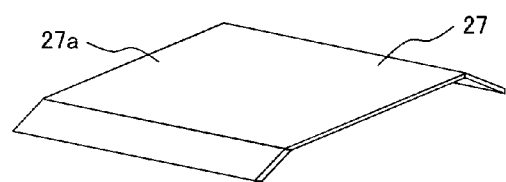

FIG. 10(a) is a front view illustrating the section around the motherboard according to a third embodiment of the present invention. FIG. 10(b) shows the shape of a leaf spring.

Referring to FIG. 10(a), the third embodiment is configured so that the leaf spring 27 is inserted between the metal plate 23 and the motherboard 7. The leaf spring 27 is disposed on the entire surface of the metal plate 23 or on a portion corresponding to the protrusions 23a of the metal plate 23. Further, as is the case with FIG. 6, the thermally-conductive sheet 31 described with reference to FIG. 5 is disposed to face the upside or underside of the CPU 2, memories 3, and controller element 4 mounted on the CPU board 1.

As shown in FIG. 10(b), the leaf spring is prepared by bending an elastic metal plate into the shape of a mountain. As the flat metal plate 23 needs to be pushed upward in the present embodiment, the leaf spring 27 has a flat portion 27a that comes into planar contact with the metal plate 23. As the leaf spring 27 is compressed when it is inserted between the metal plate 23 and the motherboard 7, the metal plate 23 is constantly pushed upward.

The shape of the leaf spring 27 is not limited to the one shown in FIG. 10(b). The leaf spring 27 may be of any shape as far as it pushes up the metal plate 23.

Figure 11:
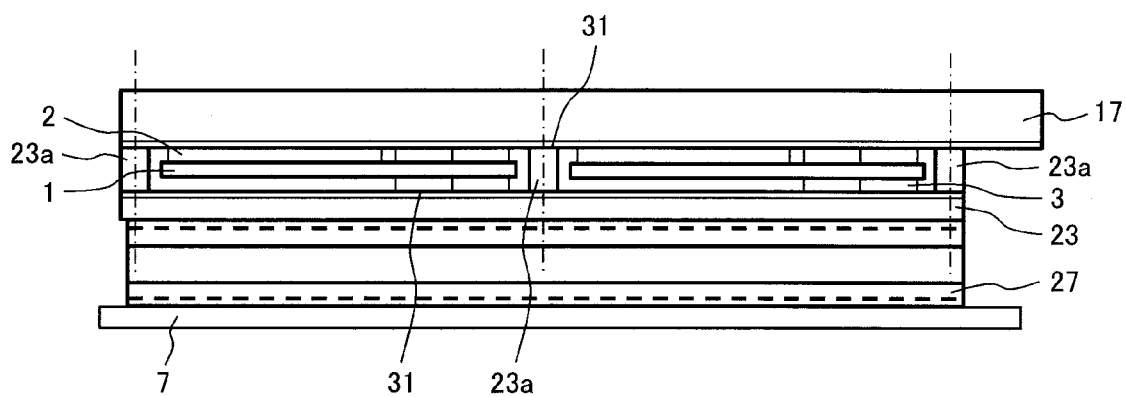
FIG. 11 is a front view illustrating the section around the motherboard after the mounting of the CPU board according to the third embodiment.

FIG. 11 is a front view illustrating the section around the motherboard after the mounting of the CPU board according to the third embodiment.

Referring to FIG. 11, when the metal plate 23 is pushed up from the motherboard 7 toward the thermo-siphon 17 due to the elasticity of the leaf spring 27, the protrusions 23a come into contact with the thermo-siphon 17. The thermally-conductive sheet 31 attached to the thermo-siphon 17 and the thermally-conductive sheet 31 attached to the metal plate 23 thermally join the upper surface (upside) of the CPU board 1 to the thermo-siphon 17 and thermally join the lower surface (underside) of the CPU board 1 to the metal plate 23. Further, the protrusions 23a of the metal plate 23 thermally join the metal plate 23 to the thermo-siphon 17.

As is obvious from the above, the heat of the semiconductor elements (CPU 1, memories 2, and controller element 4) on the upside of the CPU board 1 can be thermally transported to the thermo-siphon 17. Further, the heat of the semiconductor elements (memories 2) on the underside of the CPU board 1 can be thermally transported to the thermo-siphon 17 through the flat heat pipe or metal plate 23.

According to the present embodiment, the leaf spring 27 pushes up the metal plate 23. Therefore, the protrusions 23a of the metal plate 23 come into contact with the thermo-siphon 17 to dissipate the heat of the memories 3.

Figure 12:
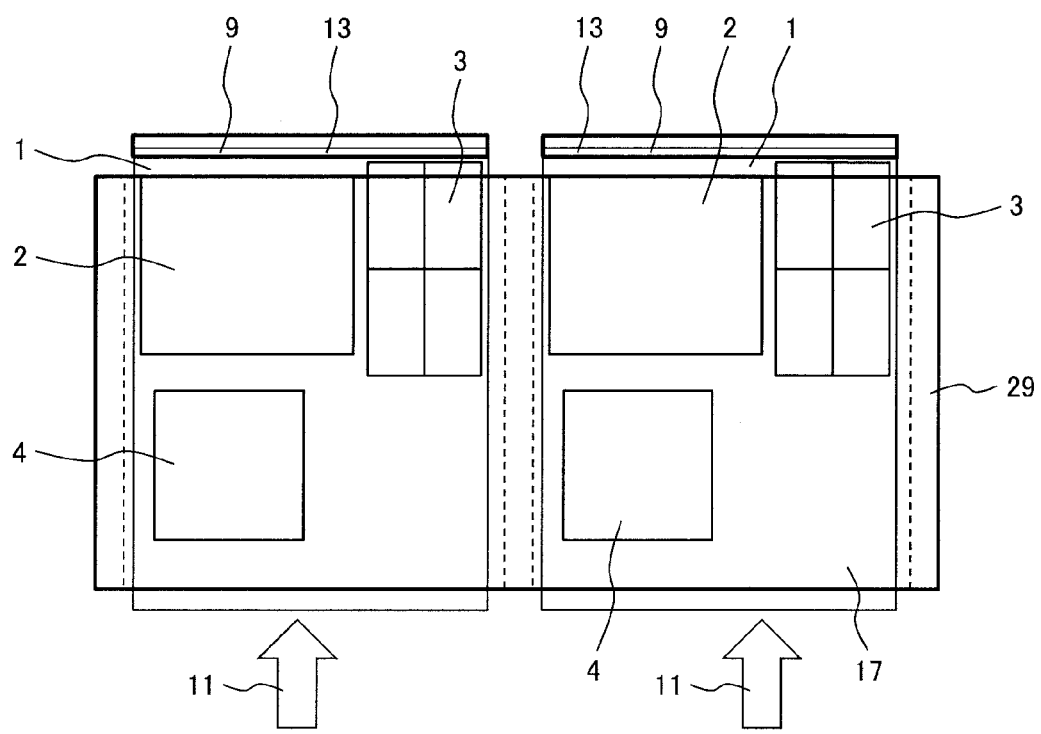
FIG. 12 is a top view illustrating the section around the motherboard after the mounting of the CPU board according to the first, second, and third embodiments.

FIG. 12 is a top view illustrating the section around the motherboard after the mounting of the CPU board according to the first, second, and third embodiments.

Referring to FIG. 12, which does not depict the screws 25, clip 26, and leaf spring 27 in the first to third embodiments, a thermal connector 29 is a joint between thermo-siphon 17 and the protrusions 23a of the metal plate 23. The signal connector 9 and the power connector 13 provide a signal or power connection between the CPU board 1 and the motherboard.

The signal connector 9, the power connector 13, and the thermal connector 29 are oriented so that they do not interfere with each other in the insertion direction 11 of the CPU board 1. Thus, the CPU board 1 can be unmounted and remounted with ease.

When the above-described configuration is employed, a cooling system that facilitates the unmounting and remounting of a module board can be provided for a computer that is used, for instance, in a server, a storage device, or a network device and formed of a large-size circuit board on which the module board having a CPU, memories, and controller element for processing is mounted.

According to the present invention, which has been described above, the cooling system and the computer provided with the cooling system do not have a cooling fan. This makes it possible to provide increased energy savings and reduce fan-induced noise. Further, the heat of the semiconductor elements on the underside of the module board can be transferred to the thermo-siphon in order to cool the entire module board. Furthermore, the present invention provides the computer that makes it easy to unmount and remount the module board because it can be unmounted and remounted by removing or reinstalling the screws, the clip, or the leaf spring.

Moreover, the present invention facilitates the unmounting and remounting of the module board included in a computer that is used, for instance, in a server, a storage device, or a network device and formed of a large-size circuit board on which the module board having a CPU, memories, and controller element for processing is mounted.

REFERENCE SIGNS LIST

1 . . . CPU board,
2 . . . CPU,
3 . . . memory,
4 . . . controller element,
5 . . . upside,
6 . . . underside,
7 . . . motherboard,
8 . . . rear end,
9 . . . signal connector,
10 . . . optical module,
11 . . . insertion direction,
12 . . . front end,
13 . . . power connector,
14 . . . optical connector,
16 . . . power supply unit,
17 . . . thermo-siphon,
18 . . . thermal highway,
19 . . . rack,
20 . . . heat exchanger,
23 . . . metal plate,
23a . . . protrusion,
23b . . . space,
25 . . . screw,
26 . . . clip,
27 . . . leaf spring,
27a . . . flat portion,
29 . . . thermal connector,
30 . . . power supply busbar,
31 . . . thermally-conductive sheet

The invention claimed is:

1. A computer provided with a cooling system and equipped with a module board with semiconductor elements mounted on both sides thereof, a motherboard on which a plurality of units of the module board are mounted, and a rack cabinet on which a plurality of units of the motherboard are mounted, the computer comprising:
- a thermo-siphon that is thermally connected to the semiconductor elements mounted on a first side of the module board;
- a metal plate that is thermally connected to the semiconductor elements mounted on a second side of the module board;
- a thermally-conductive member that transfers heat from the metal plate to the thermo-siphon in a situation where heat from the semiconductor elements mounted on the second side of the module board is transferred to the metal plate; and
- a pressing member that presses the thermo-siphon and the metal plate against the semiconductor elements mounted on the module board.

2. The computer provided with the cooling system according to claim 1, wherein the pressing member is formed of a screw that penetrates through the thermo-siphon and brings a protrusion of the metal plate into contact with the surface of the thermo-siphon.

3. The computer provided with the cooling system according to claim 1, wherein the pressing member is formed of a clip that holds the thermo-siphon and the metal plate together.

4. The computer provided with the cooling system according to claim 3, wherein the clip is formed of an elastic metal member and shaped like a U-shaped hair pin.

5. The computer provided with the cooling system according to claim 1, wherein the pressing member is formed of a leaf spring disposed between the metal plate and the motherboard.

6. The computer provided with the cooling system according to claim 5, wherein the leaf spring is formed of an elastic metal member and provided with a flat surface that comes into contact with the metal plate.

* * * * *